US009910078B2

(12) United States Patent
Lawrence et al.

(10) Patent No.: US 9,910,078 B2
(45) Date of Patent: Mar. 6, 2018

(54) NEUTRAL FAULT CURRENT DETECTION DEVICE

(71) Applicant: PPC Broadband, Inc., East Syracuse, NY (US)

(72) Inventors: Michael E. Lawrence, Syracuse, NY (US); Raymond W. Palinkas, Canastota, NY (US)

(73) Assignee: PPC Broadband, Inc., East Syracuse, NY (US)

( * ) Notice: Subject to any disclaimer, the term of this patent is extended or adjusted under 35 U.S.C. 154(b) by 72 days.

(21) Appl. No.: 14/607,852

(22) Filed: Jan. 28, 2015

(65) Prior Publication Data
US 2015/0212140 A1 Jul. 30, 2015

Related U.S. Application Data

(60) Provisional application No. 61/932,468, filed on Jan. 28, 2014, provisional application No. 61/932,453, filed on Jan. 28, 2014.

(51) Int. Cl.
*G01R 31/02* (2006.01)
(52) U.S. Cl.
CPC .................... *G01R 31/025* (2013.01)
(58) Field of Classification Search
CPC ............................ G01R 31/025; G01R 31/02
See application file for complete search history.

(56) References Cited

U.S. PATENT DOCUMENTS

| 4,875,864 A * | 10/1989 | Campbell | H01R 4/643 439/100 |
| 2002/0034970 A1* | 3/2002 | Higuchi | G08B 3/1041 455/567 |
| 2011/0215811 A1* | 9/2011 | Lenzie | G01R 31/025 324/508 |
| 2011/0304339 A1* | 12/2011 | Schumacher | G01R 31/025 324/509 |

(Continued)

OTHER PUBLICATIONS

May 6, 2015 International Search Report and Written Opinion issued in International Application No. US2015/013358.

(Continued)

*Primary Examiner* — Jermele M Hollington
*Assistant Examiner* — Suresh K Rajaputra
(74) *Attorney, Agent, or Firm* — Oliff PLC

(57) ABSTRACT

A passive neutral fault current detection device fastened to cable television equipment detects the presence of a neutral fault within a subscriber's premises when the outer conductor of the coaxial cable is electrically bonded to the neutral conductor of the premises electrical service ground. In one example, the passive neutral fault current detection device employs a transformer circuit. The braided outer conductor of the coax cable acts as the primary coil of the transformer, and windings surrounding the coax cable act as a secondary coil. The windings are connected to an alert device to complete the circuit. As alternating current from a neutral fault flows through the braided sheath, a varying magnetic field is generated and impinges upon the secondary winding, which induces a varying voltage in the secondary winding. The voltage can drive the alert device which, in one embodiment, is a light emitting diode (LED).

20 Claims, 11 Drawing Sheets

(56) References Cited

U.S. PATENT DOCUMENTS

2013/0021163 A1* 1/2013 Watford ................ H02H 3/046
                                                    340/638
2013/0183043 A1  7/2013 Elberbaum

OTHER PUBLICATIONS

Aug. 11, 2016 International Preliminary Report on Patentability issued in International Application No. PCT/US2015/013358.
Oct. 4, 2017 Extended European Search Report issued in European Patent Application No. 15742929.1.

* cited by examiner

NEUTRAL FAULT CURRENT DETECTION DEVICE

CROSS REFERENCE TO RELATED APPLICATIONS

This application claims the benefit and priority of U.S. Provisional Patent Application No. 61/932,468, filed on Jan. 28, 2014, and U.S. Patent Application Ser. No. 61/932,453, filed on Jan. 28, 2014. The entire contents of such applications are hereby incorporated by reference.

BACKGROUND

This disclosure relates generally to electrical current detection devices and, more specifically, to an electrical current detection device for coaxial cables.

Referring to FIG. 1, a typical hybrid fiber coax (HFC) broadband network that combines optical fiber and coaxial cable requires grounding of the subscriber premise coaxial network. This is usually accomplished through a coaxial splice connector at the outdoor junction device (J), which includes means to attach a ground wire that is subsequently terminated to the ground connection of the premise electrical service.

For electrical current to flow, there must be a return path back to the source. In a home or premise, the source is the power company's distribution transformer (T), and the path for the return current is the power company's neutral conductor (N). However, there are occurrences when the utility power company's neutral connection is weakened by corrosion or poor mechanical splicing, illustrated at Premise A. In the event of a loose or open neutral connection, the current will seek the path of least resistance. Often, this path is through the cable company's ground conductor because it is tied into the power company's neutral connection. As can be seen by the arrows, the coaxial cable (C) can become the conducting means to complete the current of the in-home A/C electrical service.

In the illustrated example, the return current flows backwards through the cable ground wire to the outdoor junction device, through the braid of the coax cable to the cable company's distribution box (D), to the Premise B junction device, and then through premise B's neutral conductor back to the transformer (T).

The amount of current that flows through the coaxial cable varies depending on the severity of the loss of the power utility neutral connection. Small amounts of current may not pose a direct electrical shock hazard, but will introduce undesired levels of upstream ingress into the coax network. In extreme cases, the current will melt the coax cable, resulting in loss of cable service or sparks/shock while connecting the drop coax to the cable plant.

When a loose or open neutral conductor is suspected, a clamp-on ammeter can be used by knowledgeable personnel to confirm the high sheath current condition. Although this detection method can be useful and may be advantageous for certain applications, it suffers from drawbacks. For example, loss of service and damage to the cable has already occurred. Furthermore, most cable technicians do not carry and are not trained to use a clamp-on ammeter.

SUMMARY

In one aspect, there is disclosed a multichannel data network including a cable television device connected to a coaxial cable at a point of demarcation. The cable television device provides a bonded ground path from a ground path conductor element of the coaxial cable to a neutral conductor of an electrical service ground connection. A neutral fault current detection device detects an alternating current in the ground path conductor element of the coaxial cable. The neutral fault current detection device includes a coupling element for coupling to the ground path conductor element of the coaxial cable, a passive current sensing circuit coupled to the coupling element to detect a neutral fault current flow in the ground path conductor element of the coaxial cable when the coupling element is coupled to the ground path conductor element. The neutral fault current detection device further includes a passive neutral fault alert device coupled to the current sensing circuit to generate a neutral fault condition alert when the current sensing circuit detects the neutral fault current flow in the ground path conductor element of the coaxial cable. The passive current sensing circuit is powered only by the detected neutral fault current flow in the ground path conductor element of the coaxial cable. Furthermore, the neutral fault alert device is powered only by the detected neutral fault current flow in the ground path conductor element of the coaxial cable, and only after the passive current sensing circuit detects the neutral fault current flow.

In another aspect, a neutral fault current detection device detects the presence of electrical current in a ground path of a coaxial cable in a multichannel data network. The current detection device includes a current sensing circuit for sensing current flow in a ground path conductor element of the coaxial cable. The current detection device further includes a coupling element coupled to the current sensing circuit. The coupling element engages the ground path conductor element of the coaxial cable. The current detection device further includes a neutral fault alert device coupled to the current sensing circuit. The signaling device provides an alert when the current flow in the ground path conductor element exceeds a threshold level. The current sensing circuit is powered by the current flow in the ground path conductor element.

Additional features and advantages of the present disclosure are described in, and will be apparent from, the following Brief Description of the Drawings and Detailed Description.

BRIEF DESCRIPTION OF THE DRAWINGS

The features described herein can be better understood with reference to the drawings described below. The drawings are not necessarily to scale, emphasis instead generally being placed upon illustrating the principles of the invention. In the drawings, like numerals are used to indicate like parts throughout the various views.

DETAILED DESCRIPTION

1. Network and Interfaces

Figure 1:
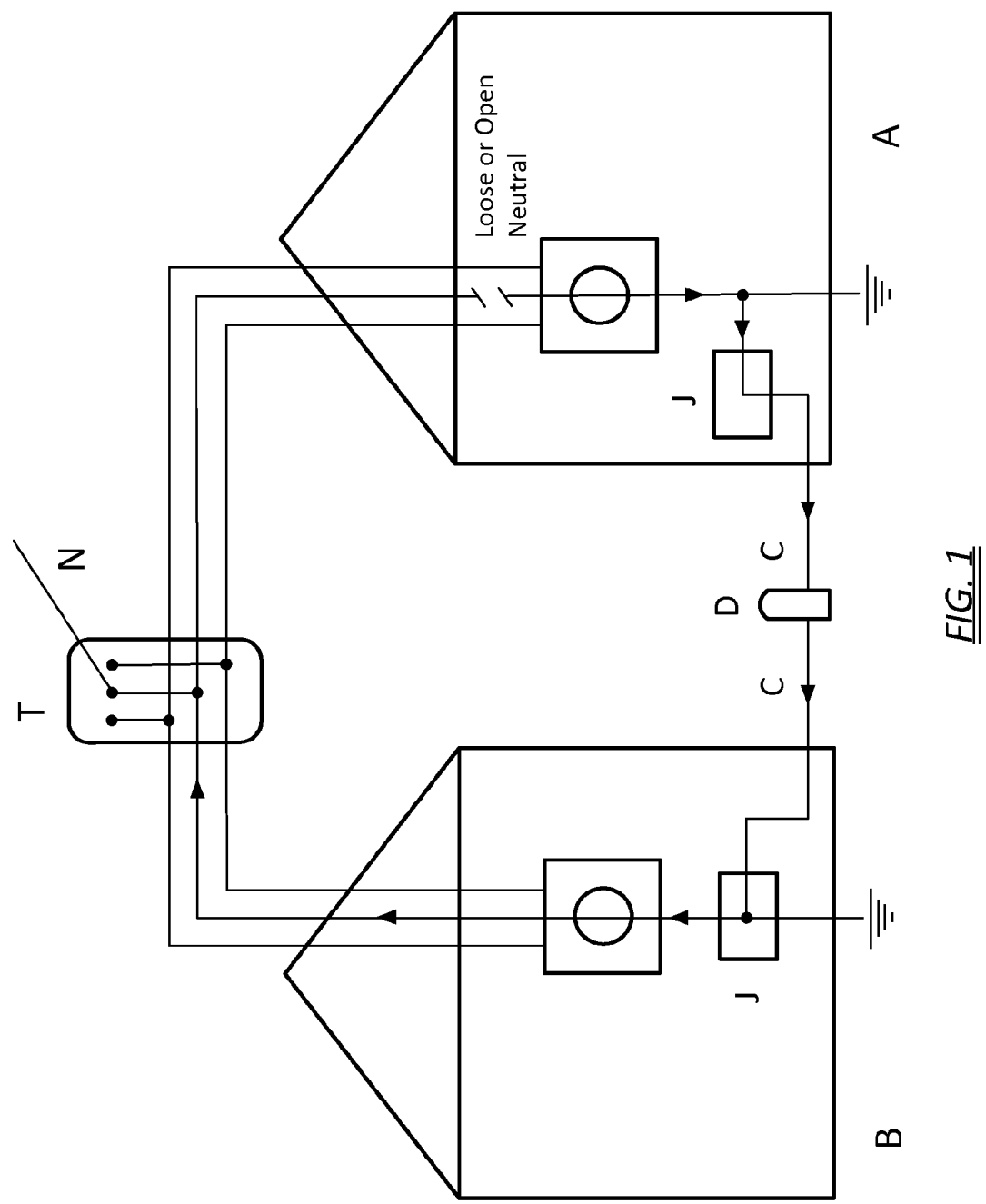
FIG. 1 is a schematic diagram illustrating a loose or open neutral conductor in a premise.
Figure 2:
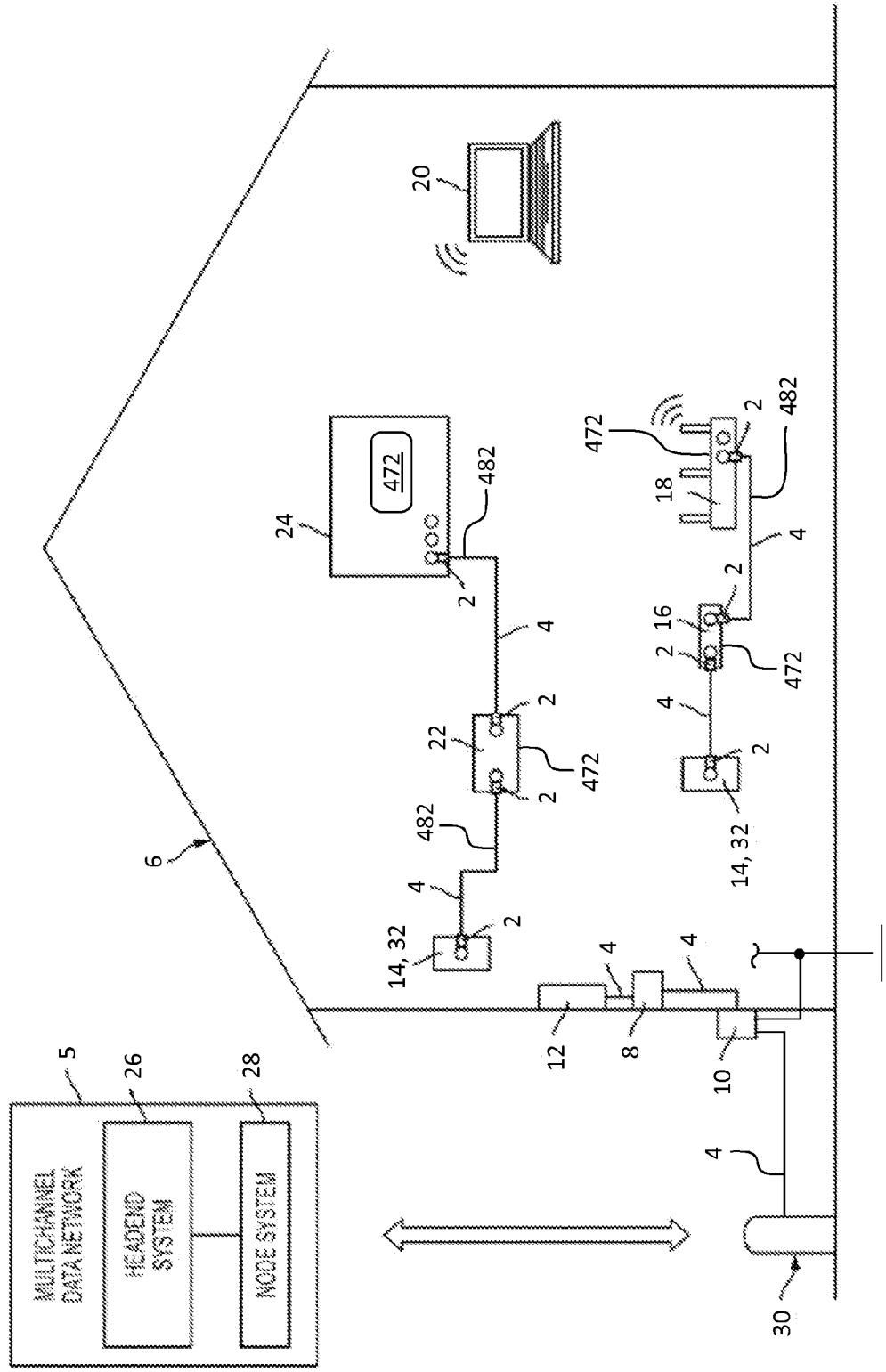
FIG. 2 is a schematic diagram illustrating an environment coupled to a multichannel data network.
Figure 3:
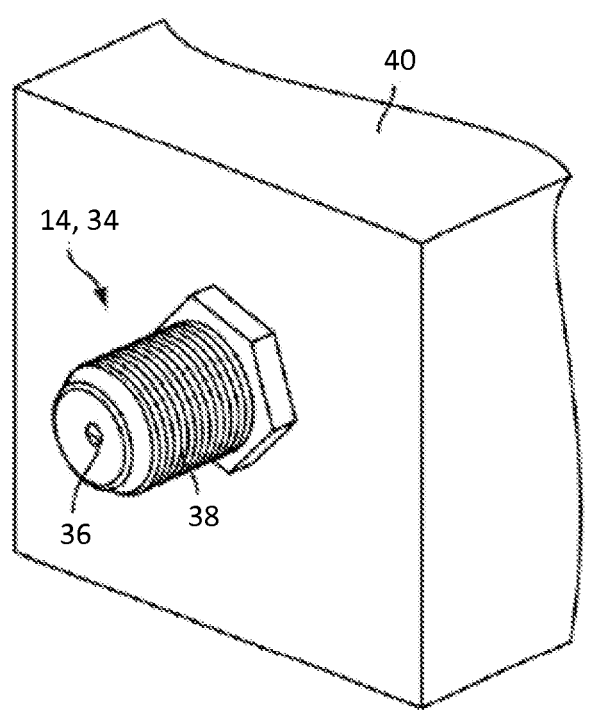
FIG. 3 is an isometric view of one embodiment of an interface port which is configured to be operatively coupled to the multichannel data network.

Referring to FIGS. 2-3, cable connectors 2 are attached to cable 4 to enable the exchange of data signals between a broadband network or multichannel data network 5, and various devices within a home, building, venue or other environment 6. For example, the environment's devices can include: (a) a point of entry ("PoE") filter 8 operatively coupled to the outdoor cable ground block 10; (b) one or more signal splitters within a service panel 12 which distributes the data service to interface ports 14 of various rooms or parts of the environment 6; (c) a modem 16 which modulates radio frequency ("RF") signals to generate digital signals to operate a wireless router 18; (d) an Internet accessible device, such as a mobile phone or computer 20, wirelessly coupled to the wireless router 18; and (e) a set-top unit 22 coupled to a television ("TV") 24. In one embodiment, the set-top unit 22, typically supplied by the data provider (e.g., the cable TV company) includes a TV tuner and a digital adapter for High Definition TV.

In one distribution method, the data service provider operates a headend facility or headend system 26 coupled to a plurality of optical node facilities or node systems, such as node system 28. The data service provider operates the node systems as well as the headend system 26. The headend system 26 multiplexes the TV channels, producing light beam pulses which travel through optical fiber trunk lines. The optical fiber trunk lines extend to optical node facilities in local communities. The node system 28 translates the light pulse signals to RF electrical signals. The data service provider then uses cable 4 to distribute the RF signals to the environments 6.

In another distribution method, the data service provider operates a series of satellites. The service provider installs an outdoor antenna or satellite dish at the environment 6. The data service provider connects a coaxial cable to the satellite dish. The coaxial cable distributes the RF signals or channels of data into the environment 6.

In one embodiment, the multichannel data network 5 includes a telecommunications, cable/satellite TV ("CATV") network operable to process and distribute different RF signals or channels of signals for a variety of services, including, but not limited to, TV, Internet and voice communication by phone. For TV service, each unique radio frequency or channel is associated with a different TV channel. The set-top unit 22 converts the radio frequencies to a digital format for delivery to the TV. Through the multichannel data network 5, the service provider can distribute a variety of types of data, including, but not limited to, TV programs including on-demand videos, Internet service including wireless or WiFi Internet service, voice data distributed through digital phone service or Voice Over Internet Protocol (VoIP) phone service, Internet Protocol TV ("IPTV") data streams, multimedia content, audio data, music, radio and other types of data.

In one embodiment, the multichannel data network 5 is operatively coupled to a multimedia home entertainment network serving the environment 6. In one example, such multimedia home entertainment network is the Multimedia over Coax Alliance (MoCA) network. The MoCA network increases the freedom of access to the multichannel data network 5 at various rooms and locations within the environment 6. The MoCA network, in one embodiment, operates on cable 4 within the environment 6 at frequencies in the range 1125 MHz to 1675 MHz. MoCA compatible devices can form a private network inside the environment 6.

In one embodiment, the MoCA network includes a plurality of network-connected devices, including, but not limited to: (a) passive devices, such as the PoE filter 8, internal filters, diplexers, traps, line conditioners and signal splitters; and (b) active devices, such as amplifiers. The PoE filter 8 provides security against the unauthorized leakage of a user's signal or network service to an unauthorized party or non-serviced environment. Other devices, such as line conditioners, are operable to adjust the incoming signals for better quality of service. For example, if the signal levels sent to the set-top unit 22 do not meet designated flatness requirements, a line conditioner can adjust the signal level to meet such requirement.

In one embodiment, the modem 16 includes a monitoring module. The monitoring module continuously or periodically monitors the signals within the MoCA network. Based on this monitoring, the modem 16 can report data or information back to the headend system 26. Depending upon the embodiment, the reported information can relate to network problems, device problems, service usage or other events.

At different points in the multichannel data network 5, cable 4 can be located indoors, outdoors, underground, within conduits, above ground mounted to poles, on the sides of buildings and within enclosures of various types and configurations. Cables 4 can also be mounted to, or installed within, mobile environments, such as land, air and sea vehicles.

As described above, the data service provider uses coaxial cable 4 to distribute the data to the environment 6. Therefore, the environment 6 has an array of coaxial cable 4 at different locations. The cable connectors 2 are attachable to the coaxial cable 4. The cable 4, through use of the cable connectors 2, are connectable to various communication or interfaces within the environment 6, such as interface ports 14 illustrated in FIGS. 2-3. In the example shown, interface ports 14 are incorporated into: (a) a signal splitter within an outdoor cable service or distribution box 30 which distributes data service to multiple homes or environments 6 close to each other; (b) a signal splitter within the outdoor cable junction box or cable ground block 10 which distributes the data service into the environment 6; (d) the set-top unit 22; (e) the television 24; (f) wall-mounted jacks, such as a wall plate 32; and (g) the wireless router 18.

In one embodiment, each of the interface ports 14 includes a stud or male jack, such as the stud 34 illustrated in FIG. 3. The stud 34 has an inner, cylindrical wall 36 defining a central hole. Stud 34 has an electrical contact (not shown) positioned within the central hole. In one embodiment, stud 34 is shaped and sized to be compatible with the F-type coaxial connection standard. It should be understood that, depending upon the embodiment, stud 34 could have a threaded outer surface 38 as shown, or stud 34 could have a smooth outer surface. Stud 34 can be operatively coupled to, or incorporated into, a device 40. As described above, device 40 can include, for example, a cable splitter of a distribution box 30, outdoor cable junction box 10 or service panel 12; a set-top unit 22; a television 24; a wall plate 32; a modem 16; or a router 18.

During installation, the installer couples a cable 4 to an interface port 14 by screwing or pushing the connector 2 onto the stud 34. Once installed, the connector 2 receives the stud 34. The connector 2 establishes an electrical connection between the cable 4 and the electrical contact of the stud 34.

After installed, the connectors 2 often undergo various forces. For example, there may be tension in the cable 4 as it stretches from one device 40 to another device 40, causing a constant force on a connector 2. A user might occasionally move, pull or push on a cable 4 from time to time, causing forces on a connector 2. A user might frequently swivel or shift the position of a television 24, causing forces on a connector 2. As described below, the connector 2 is structured to maintain a suitable level of electrical connectivity despite such forces.

2. Cable

Figure 5:
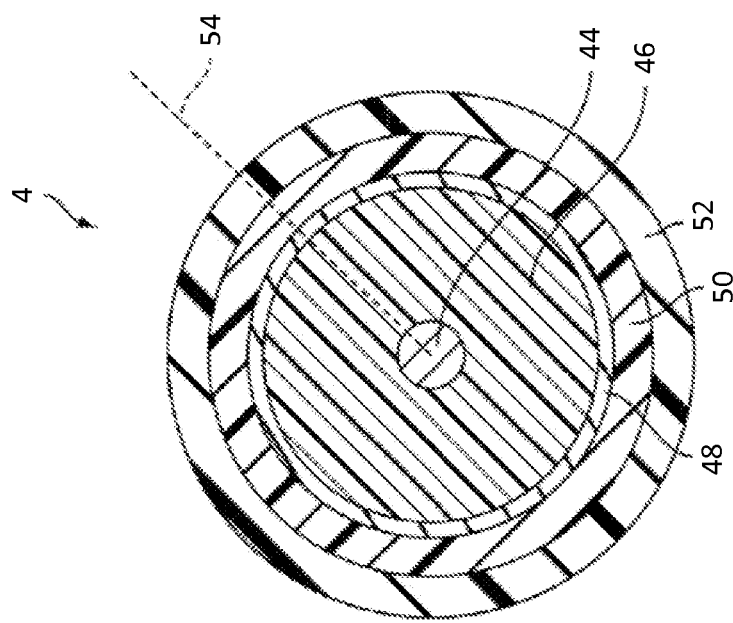
FIG. 5 is a cross-sectional view of the cable of FIG. 4, taken substantially along line 5-5.
Figure 4:
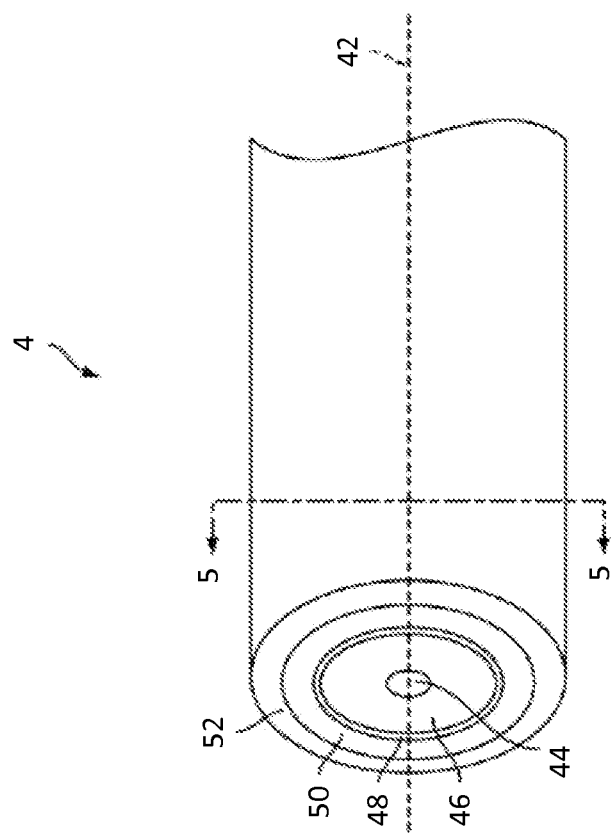
FIG. 4 is an isometric view of one embodiment of a cable which is configured to be operatively coupled to the multichannel data network.

Referring to FIGS. 4-5, the cable 4 extends along a cable axis or a longitudinal axis 42. In one embodiment, the cable 4 includes: (a) an elongated center conductor or inner conductor 44; (b) an elongated insulator 46 coaxially surrounding the inner conductor 44; (c) an elongated, conductive foil layer 48 coaxially surrounding the insulator 46; (d) an elongated outer conductor 50 coaxially surrounding the foil layer 48; and (e) an elongated sheath, sleeve or jacket 52 coaxially surrounding the outer conductor 50.

The inner conductor 44 is operable to carry data signals to and from the multichannel data network 5. Depending upon the embodiment, the inner conductor 44 can be a strand, a solid wire or a hollow, tubular wire. The inner conductor 44 is, in one embodiment, constructed of a conductive material suitable for data transmission, such as a metal or alloy including copper, including, but not limited, to copper-clad aluminum ("CCA"), copper-clad steel ("CCS") or silver-coated copper-clad steel ("SCCCS").

The insulator 46, in one embodiment, is a dielectric having a tubular shape. In one embodiment, the insulator 46 is radially compressible along a radius or radial line 54, and the insulator 46 is axially flexible along the longitudinal axis 42. Depending upon the embodiment, the insulator 46 can be a suitable polymer, such as polyethylene ("PE") or a fluoropolymer, in solid or foam form.

In the embodiment illustrated in FIG. 4, the outer conductor 50 includes a conductive RF shield or electromagnetic radiation shield. In such embodiment, the outer conductor 50 includes a conductive screen, mesh or braid or otherwise has a perforated configuration defining a matrix, grid or array of openings. In one such embodiment, the braided outer conductor 50 has an aluminum material or a suitable combination of aluminum and polyester. Depending upon the embodiment, cable 4 can include multiple, overlapping layers of braided outer conductors 50, such as a dual-shield configuration, tri-shield configuration or quad-shield configuration.

In one embodiment, as described below, the connector 2 electrically grounds the outer conductor 50. When the inner conductor 44 and external electronic devices generate magnetic fields, the grounded outer conductor 50 sends the excess charges to ground. In this way, the outer conductor 50 cancels all, substantially all or a suitable amount of the potentially interfering magnetic fields. Therefore, there is less, or insignificant, disruption of the data signals running through inner conductor 44. Also, there is less, or insignificant, disruption of the operation of external electronic devices near the cable 4.

In such embodiment, the cable 4 has two electrical grounding paths. The first grounding path runs from the inner conductor 44 to ground. The second grounding path runs from the outer conductor 50 to ground.

The conductive foil layer 48, in one embodiment, is an additional, tubular conductor which provides additional shielding of the magnetic fields. In one embodiment, the foil layer 48 includes a flexible foil tape or laminate adhered to the insulator 46, assuming the tubular shape of the insulator 46. The combination of the foil layer 48 and the outer conductor 50 can suitably block undesirable radiation or signal noise from leaving the cable 4. Such combination can also suitably block undesirable radiation or signal noise from entering the cable 4. This can result in an additional decrease in disruption of data communications through the cable 4 as well as an additional decrease in interference with external devices, such as nearby cables and components of other operating electronic devices.

In one embodiment, the jacket 52 has a protective characteristic, guarding the cable's internal components from damage. The jacket 52 also has an electrical insulation characteristic. In one embodiment, the jacket 52 is compressible along the radial line 54 and is flexible along the longitudinal axis 42. The jacket 52 is constructed of a suitable, flexible material such as polyvinyl chloride (PVC) or rubber. In one embodiment, the jacket 52 has a lead-free formulation including black-colored PVC and a sunlight resistant additive or sunlight resistant chemical structure.

Figure 6:
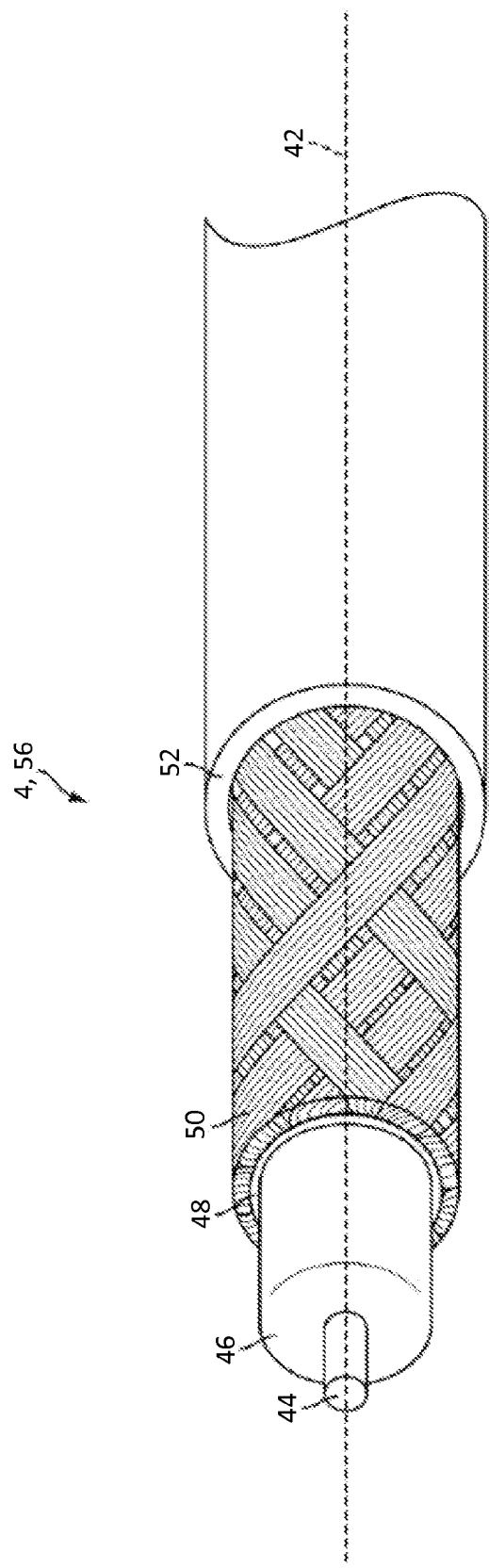
FIG. 6 is an isometric view of one embodiment of a cable which is configured to be operatively coupled to the multichannel data network, illustrating a three step shaped configuration of a prepared end of the cable.
Figure 7:
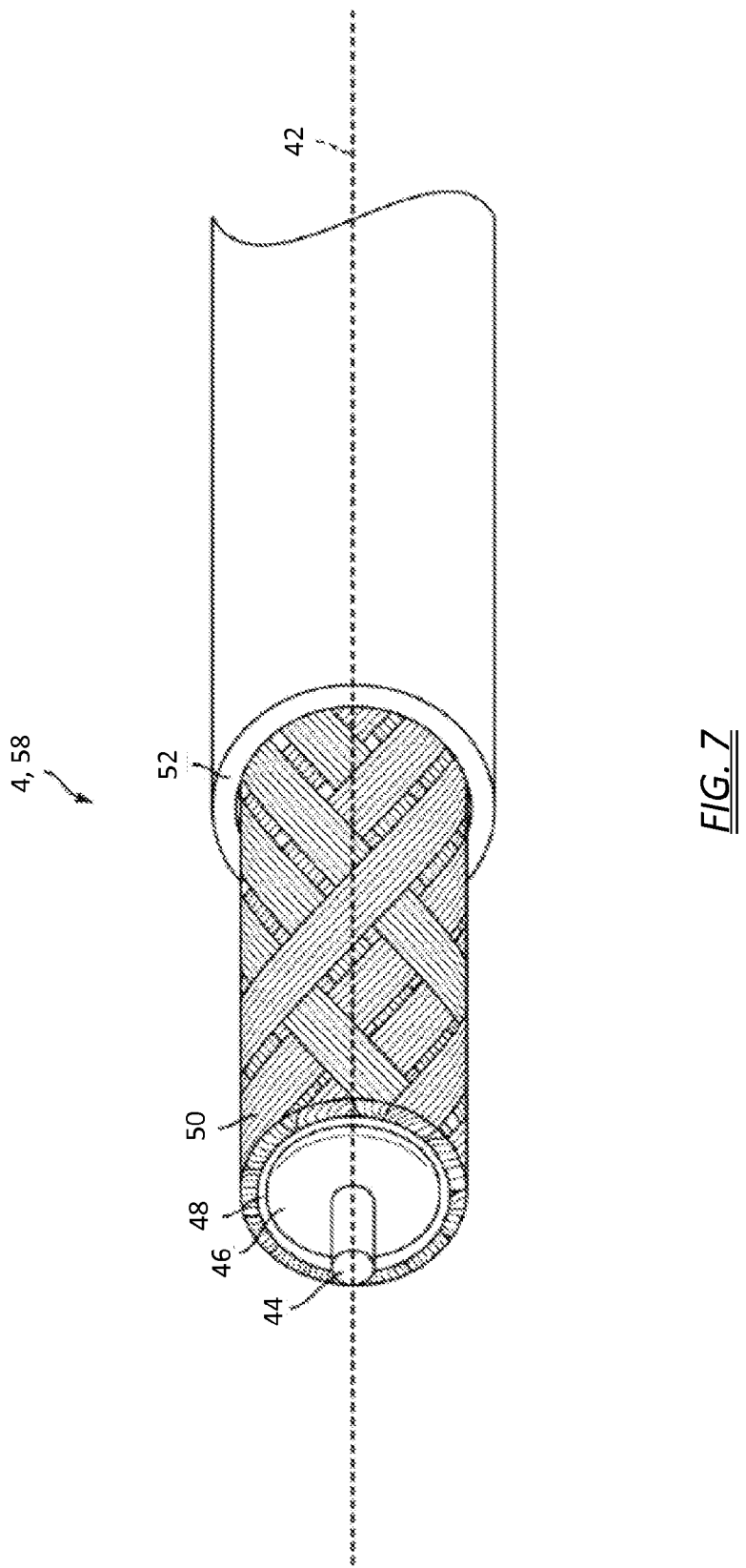
FIG. 7 is an isometric view of one embodiment of a cable which is configured to be operatively coupled to the multichannel data network, illustrating a two step shaped configuration of a prepared end of the cable.

Referring to FIGS. 6-7, in one embodiment an installer or preparer prepares a terminal end 56 of the cable 4 so that it can be mechanically connected to the connector 2. To do so, the preparer removes or strips away differently sized portions of the jacket 52, outer conductor 50, foil layer 48 and insulator 46 so as to expose the side walls of the jacket 52, outer conductor 50, foil layer 48 and insulator 46 in a stepped or staggered fashion. In the example shown in FIG. 6, the prepared end 56 has a three step-shaped configuration. In the example shown in FIG. 7, the prepared end 58 has a two step-shaped configuration. The preparer can use cable preparation pliers or a cable stripping tool to remove such portions of the cable 4. At this point, the cable 4 is ready to be connected to the connector 2.

Figure 8:
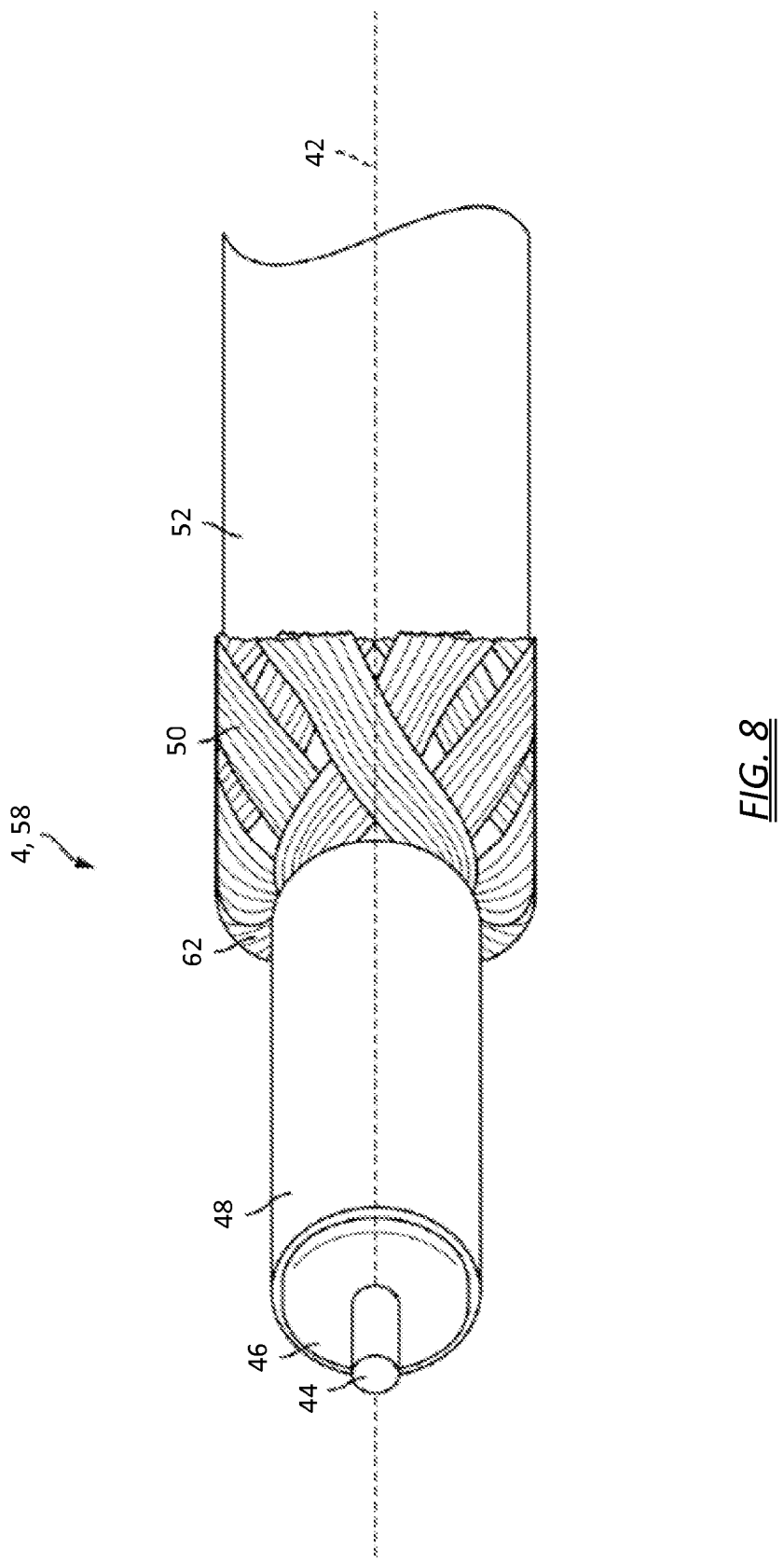
FIG. 8 is an isometric view of one embodiment of a cable which is configured to be operatively coupled to the multichannel data network, illustrating the folded-back, braided outer conductor of a prepared end of the cable.

In one embodiment illustrated in FIG. 8, the installer or preparer performs a folding process to prepare the cable 4 for connection to connector 2. In the example illustrated, the preparer folds the braided outer conductor 50 backward onto the jacket 52. As a result, the folded section 60 is oriented inside out. The bend or fold 62 is adjacent to the foil layer 48 as shown. Certain embodiments of the connector 2 include a tubular post. In such embodiments, this folding process can facilitate the insertion of such post in between the braided outer conductor 50 and the foil layer 48.

Depending upon the embodiment, the components of the cable 4 can be constructed of various materials which have some degree of elasticity or flexibility. The elasticity enables the cable 4 to flex or bend in accordance with broadband communications standards, installation methods or installation equipment. Also, the radial thicknesses of the cable 4, the inner conductor 44, the insulator 46, the conductive foil layer 48, the outer conductor 50, and the jacket 52 can vary based upon parameters corresponding to broadband communication standards or installation equipment.

Figure 9:
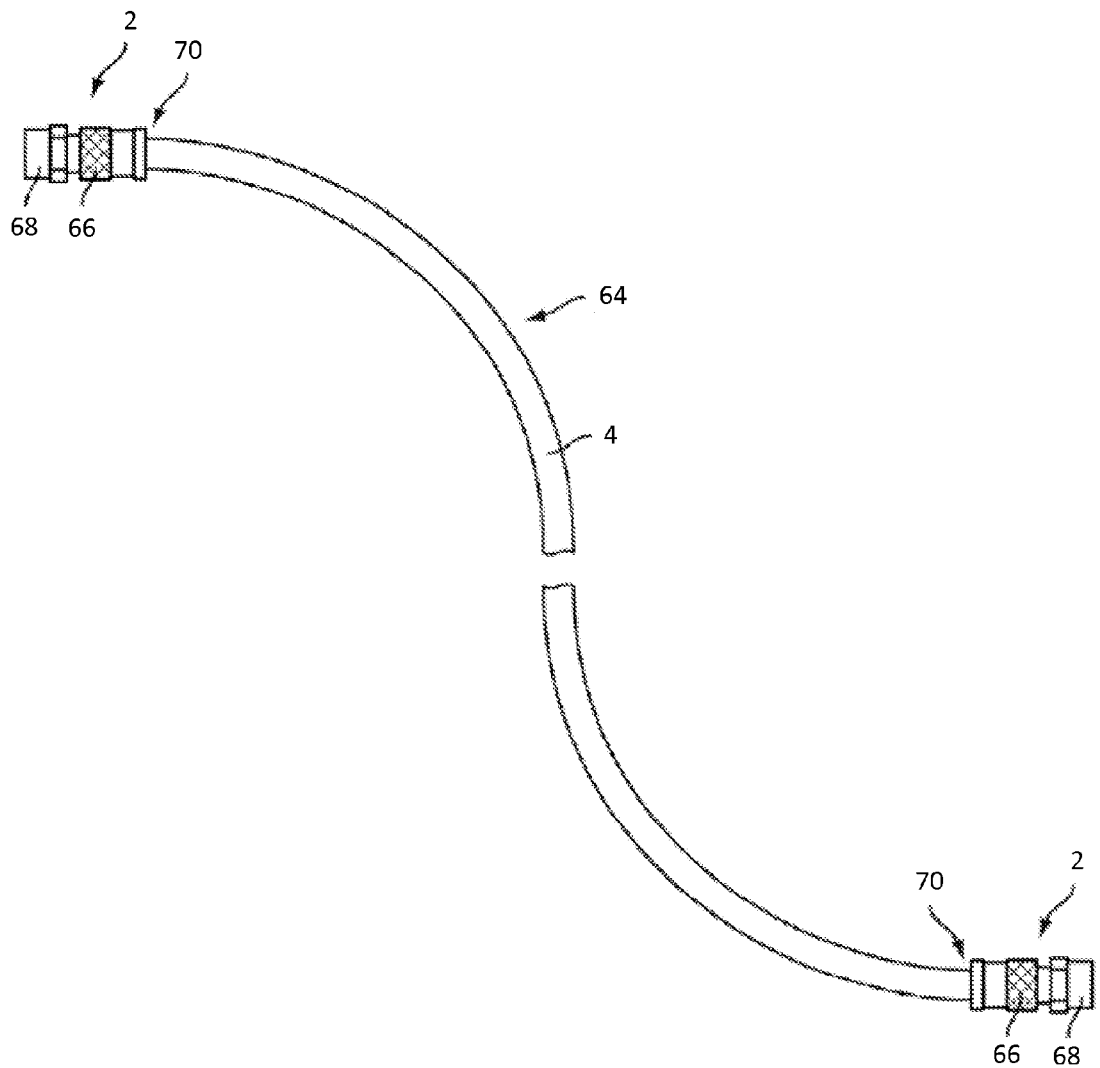
FIG. 9 is a top view of one embodiment of a cable jumper or cable assembly which is configured to be operatively coupled to the multichannel data network.

In one embodiment illustrated in FIG. 9, a cable jumper or cable assembly 64 includes a combination of the connector 2 and the cable 4 attached to the connector 2. In this embodiment, the connector 2 includes: (a) a connector body or connector housing 66; and (b) a fastener or coupler 68, such as a threaded nut, which is rotatably coupled to the connector housing 66. The cable assembly 64 has, in one embodiment, connectors 2 on both of its ends 70. Preassembled cable jumpers or cable assemblies 64 can facilitate the installation of cables 4 for various purposes.

3. Neutral Fault Current Detector

Embodiments of the present invention disclose a passive neutral fault current detection device that may be temporarily or permanently installed on a coaxial cable. In one example, the current detection device may employ a transformer circuit. The braided sheath of the coax cable outer conductor acts as the primary coil of the transformer, and windings surrounding the coax cable act as a secondary coil. The windings are connected to an alert device to complete the circuit. As alternating current from a neutral fault flows through the braided sheath, a varying magnetic field is generated and impinges upon the secondary winding, which induces a varying electromotive force (EMF) or voltage in the secondary winding. The voltage can drive the alert device which, in one embodiment, is a light emitting diode (LED).

The current detection device would not require any external power because the excessive current flowing through the sheath would be sufficient to power the current sensing circuit. The current detection device may trigger an alert to an existing or increasing dangerous current condition in the outer sheath.

Figure 10:
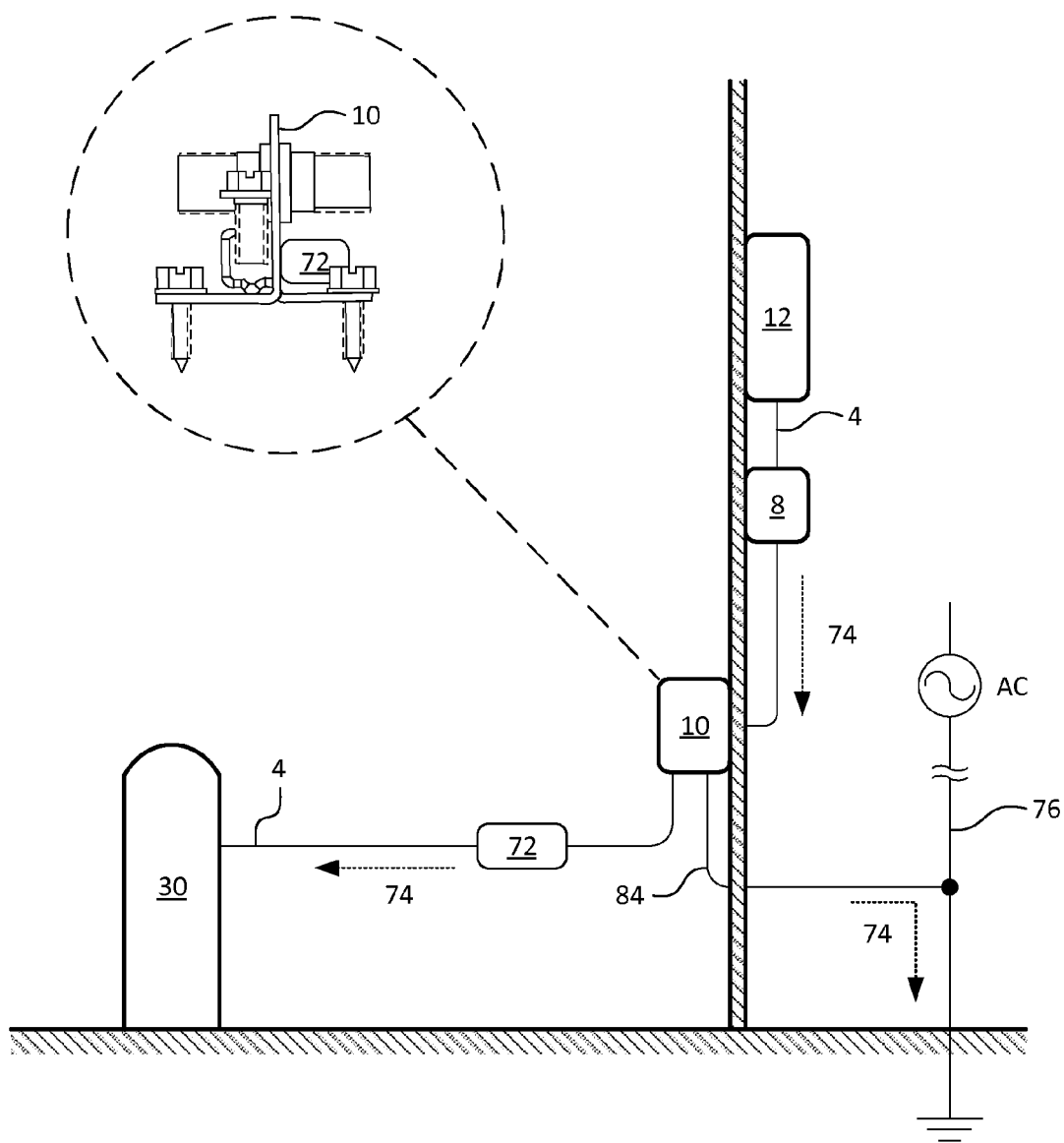
FIG. 10 is an enlarged view of the environment shown in FIG. 2, according to one embodiment of the invention.

FIG. 10 schematically illustrates one possible installation of a neutral fault current detection device 72 coupled to an outer conductor of the coaxial cable 4. In this example, the current detection device 72 is located at the point of demarcation, which is the boundary between the cable company's equipment and the premises' cable network equipment. As shown, the ground block 10 serves as the point of demarcation because the ground block 10 is configured to provide an electrically bonded ground path 74 from the outer conductor of the coaxial cable to a neutral conductor of an electrical service ground connection 76. As used herein, 'bonded ground path' means the permanent connection of metallic components to form an electrically conductive path that ensures electrical continuity and the capacity to safely conduct any current likely to be imposed.

Positioning the neutral fault current detection device 72 at the point of demarcation is useful because it is the junction for all ground paths from all the cable television devices 78 installed in the premises (i.e., element numbers 8, 10, 12, 14, 16, 18, 22, 24). In the event a neutral fault develops in the electrical service ground connection 76, or in the electrical wiring associated with any of the cable television devices, the neutral fault alternating current will flow through the outer conductor of the coax cable connected to the demarcation device (e.g., ground block 10), towards the distribution box 30. In one embodiment, shown in the inset of FIG. 10, the neutral fault current detection device 72 is fastened or otherwise permanently affixed to ground block 10. For example, the neutral fault current detection device 72 may be fastened to the ground block 10 by screws. In this manner, the neutral fault current detection device 72 can provide a permanent solution to determining if any electrical current is moving from the premises to the cable operator.

Other cable television devices can serve as the demarcation device if they have an electrically bonded ground path 74 from the outer conductor 50 of the coaxial cable to a neutral conductor of an electrical service ground connection 76. For example, PoE filter 8, service panel 12, a splitter, or multi-port amplifier.

Figure 11:
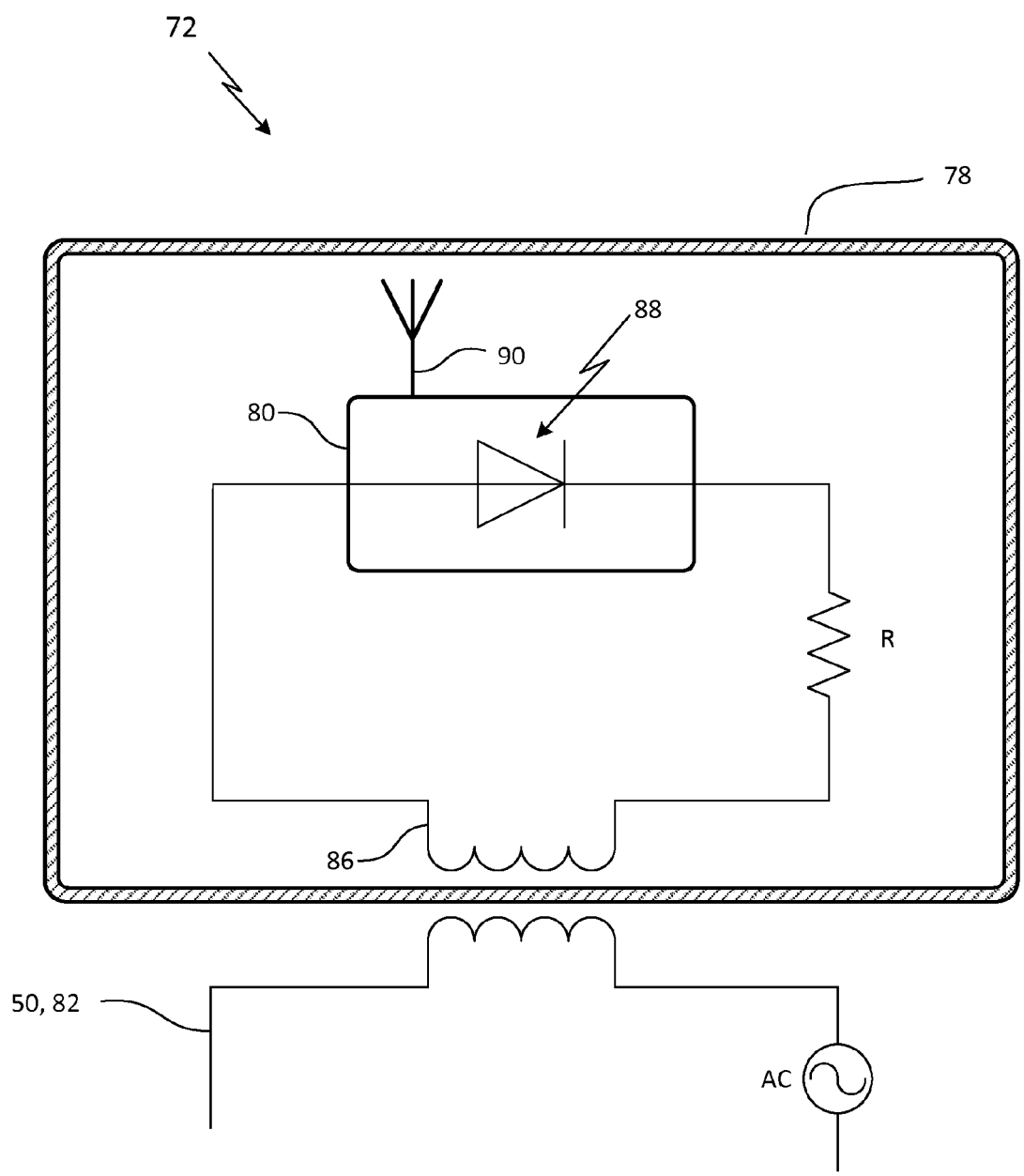
FIG. 11 is a schematic diagram of a neutral fault current detection device according to one embodiment of the invention.
Figure 12:
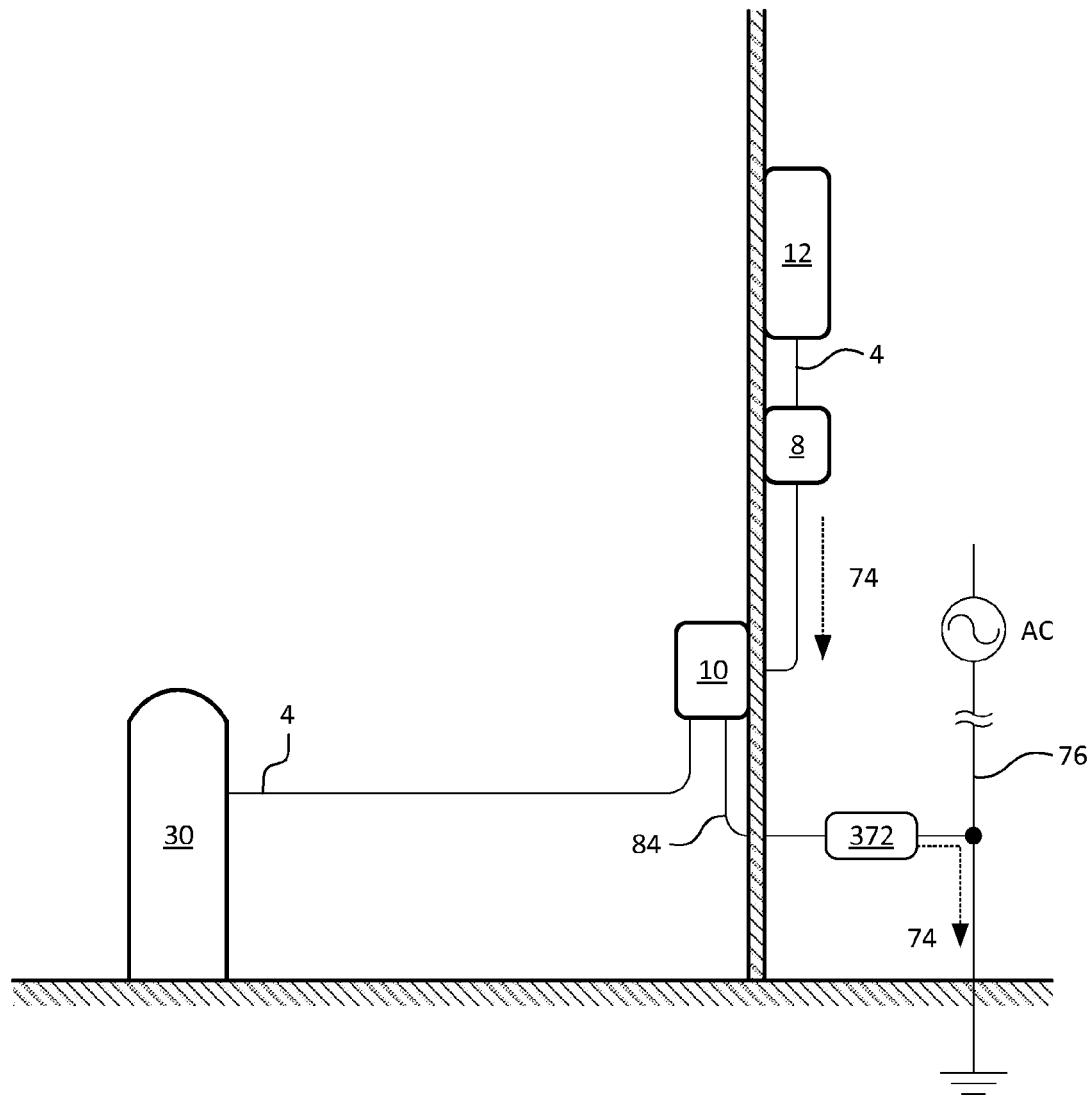
FIG. 12 is an enlarged view of the environment shown in FIG. 2, according to another embodiment of the invention.

FIG. 11 illustrates one embodiment of a neutral fault current detection device 72 configured to detect the presence of neutral fault current flowing through a ground path 74 of a CATV network's coaxial cables or a building's electrical service ground connection 76. The presence of such electrical current may indicate hazardous, excessive or otherwise undesirable current activity. In most coaxial cable configurations, the outer conductor 50 serves as the ground path 74.

The neutral fault current detection device 72 further includes a current sensing circuit 80 disposed within the cable television device 78 to sense current flow in a ground path conductor element 82 of the coaxial cable. As used herein, the term 'ground path conductor element' is taken to mean any component in the system that provides a ground path for the coaxial cable. As discussed above, the outer conductor 50 is one such component. However, other components may be configured to provide a ground path, such as a ground block, a splitter, a drop amplifier, or a connector 2, for example. Referring to FIG. 10, other possible ground path conductor elements include a suitably gaged ground wire 84 extending from the outer conductor 50 of the coaxial cable 4 to the electrical service ground connection 76. In this regard, the electrical service ground connection 76 is also a ground path conductor element. In the illustrated embodiment, the outdoor cable ground block 10 provides the connection for the ground wire 84, but the PoE filter 8 and service panel 12 would also suffice.

The neutral fault current detection device 72 further includes a coupling element 86 coupled to the current sensing circuit 80. The coupling element 86 engages the ground path conductor element 82 to allow the current sensing circuit 80 to sense the current. In some embodiments, the coupling element 86 is a physical connection to the ground path conductor element 82, such as the example given with a shunt circuit. In other embodiments, the coupling element 86 is merely within sufficient proximity to the ground path conductor element 82 so as to provide the necessary current flow in the circuit 80. In the embodiment illustrated in FIG. 11, the coupling element 86 engages the outer conductor 50 of the coaxial cable. In one embodiment illustrated in FIG. 14, the coupling element 386 (not shown) of the neutral fault current detection device 372 engages the neutral conductor 76 of the building's electrical service ground connection. The neutral conductor 76 may be connected to a water pipe, grounding rod, or outdoor electrical meter, for example.

In another embodiment illustrated in FIG. 2, a neutral fault current detection device 472 is located internally within a CATV device. The neutral fault current detection device 472 engages a ground path conductor element 82 of any device connected to the CATV network, such as the set-top unit 22, the television 24, the modem 16, or the wireless router 18, for example. The ground path conductor element 82 may be located on the coaxial cable connected to the CATV device.

Referring back to FIG. 11, the neutral fault current detection device 72 further includes a neutral fault alert device 88 coupled to an output of the current sensing circuit 80. The neutral fault alert device 88 can generate an alert when the current flow in the ground path conductor element 82 exceeds a threshold level. The threshold level may include a rate, direction, or degree of current flow which triggers an alarm condition. For example, the typical current flowing through an outer conductor of a coax cable is less than 100 mA, which is not a dangerous amount. However, should the current increase to 500 mA due to a neutral fault in the system, a person coming into contact with the outer conductor may be injured. Therefore, in one embodiment, a threshold level to trigger an alert may be 500 mA. If the current level were to increase to 1 A, a person coming into contact with the outer conductor may be seriously injured. Therefore, in another example, the threshold level to trigger an alert is 1 A.

In one embodiment of the invention, the neutral fault alert device 88 is a light generator that displays a pattern of light in response to the level of current flow. In another example, the neutral fault alert device 88 is a sound generator that produces an audible alarm tone when the current flow in the ground path conductor element 82 exceeds the threshold level.

In one example, the neutral fault alert device 88 provides an alert by means of a light emitting diode ("LED"). In this embodiment, illustrated in FIG. 11, the neutral fault current detection device 72 does not need any external power because the neutral fault current flowing through the outer conductor 50 of the coaxial cable 4 is sufficient to operate the current detection device 72 and associated circuits 80, 88.

In one embodiment, the neutral fault current detection device 72 is programmed to generate different light patterns or indicators associated with different degrees or types of grounding conditions. For example, the neutral fault alert device 88 can include a green LED, a yellow LED, a red LED, and a speaker associated with the following conditions:
  Green: No significant problem with the building grounding circuit; sensed current is below threshold value;
  Yellow: Potential, significant problem with the ground path 74 or the electrical service ground connection 76; sensed current is approaching or has reached threshold value;
  Red: Significant problem with the ground path 74 or the electrical service ground connection 76; sensed current has exceeded the threshold value; and
  Speaker: Beeping audible output indicating a significant problem with the ground path 74 or the electrical service ground connection 76.

Rather than rely on an external power source to operate the neutral fault current detection device 72, the current sensing circuit 80 can be powered passively using only the current flowing in the ground path conductor element 82. If the CATV system and the electrical service ground connection 76 are functioning normally, the outer conductor 50 of the coaxial cable does not flow an appreciable amount of current, and the current sensing circuit 80 is inactive. In this regard, the neutral fault current detection device 72 may be configured to be temporarily or permanently installed on a coaxial cable drop line 4 which provides an output alert regarding existing or growing dangerous sheath current conditions.

In one embodiment of the invention, the neutral fault alert device 88 also operates passively. That is, the neutral fault alert device 88 is powered by the current flow in the ground path conductor element 82 when the current flow exceeds a threshold level.

In a further embodiment of the invention, the neutral fault current detection device 72 is operable to trigger a powered circuit in the neutral fault alert device 88 which, in turn, is operable to generate an audible alarm or other signaling device. In one such embodiment, the powered circuit can include a battery power source.

Referring to FIG. 11, in another embodiment of the invention the neutral fault current detection device 72 may further include a transmitter 90 which sends a message upstream, through the CATV network, to the headend of the service provider. The service provider, upon receiving the message, may contact the subscriber about the potential problem with the subscriber's electrical grounding circuit. Depending upon the embodiment, the message can be sent wirelessly or through the inner conductor 44 of the coaxial cable 4.

In another embodiment of the invention, the neutral fault current detection device 72 can alert technicians, network operators and subscribers of the potentially dangerous condition of house or building power neutral fault causing excessive current in the subscriber's coaxial cable. The neutral fault current detection device 72 can alert network operators, servicers, and subscribers of a growing electrical current problem before it gets to the point where it can cause melting of coaxial cables, fire, shock or substantial loss of quality of CATV network service. A method for detecting the presence of electrical current in a ground path of a coaxial cable in a multichannel data network includes a step of providing a current sensing circuit configured to detect the presence of electrical current in a ground path of a coaxial cable in a multichannel data network. In one embodiment, the current sensing circuit is provided internally within a CATV device.

The method further includes a step of powering the current sensing circuit using the current flow in the ground path conductor element.

The method further includes a step of sensing, by the current sensing circuit, a current flow in a ground path conductor element of the coaxial cable. In one embodiment, when the ground path is connected to an electrical service ground connection, the current flow is sensed at the electrical service ground connection.

The method further includes a step for providing an alert when the current flow in the ground path conductor element exceeds a threshold level. In one embodiment, a signaling device generates a pattern of lights in response to the level of current flow. In another embodiment, a message is transmitted upstream through the coaxial cable of the multichannel data network, or over a wireless network if the neutral fault current detection device includes a modem.

One of the improvements of the present disclosure is that the neutral fault current detection device does not require any special training and can alert the technician or home owner at early stages of the building's ground neutral malfunction or impairment. Currently, only power test equipment and the knowledge to use it can be utilized to test for this condition. Additionally, since the neutral fault current detection device remains in the building's grounding circuit for the life of the building's CATV cable service, suspected intermittent issues can be monitored by the home owner or subscriber while an issue is arising or occurring, even without a technician present.

For example, a subscriber might notice a poor TV picture quality and call the CATV service provider for assistance. As an initial trouble shooting step, the service provider may ask the caller to inspect the output of the neutral fault current detection device. When viewing the current detection device, the caller might report that it has a flashing red light, indicating neutral fault. At that point, the service provider may advise the caller to contact an electrician to repair the neutral conductor of the home's or building's grounding circuit.

Additional embodiments include any one of the embodiments described above, where one or more of its components, functionalities or structures is interchanged with, replaced by or augmented by one or more of the components, functionalities or structures of a different embodiment described above.

It should be understood that various changes and modifications to the embodiments described herein will be apparent to those skilled in the art. Such changes and modifications can be made without departing from the spirit and scope of the present disclosure and without diminishing its intended advantages. It is therefore intended that such changes and modifications be covered by the appended claims.

Although several embodiments of the disclosure have been disclosed in the foregoing specification, it is understood by those skilled in the art that many modifications and other embodiments of the disclosure will come to mind to which the disclosure pertains, having the benefit of the teaching presented in the foregoing description and associated drawings. It is thus understood that the disclosure is not limited to the specific embodiments disclosed herein above, and that many modifications and other embodiments are intended to be included within the scope of the appended claims. Moreover, although specific terms are employed herein, as well as in the claims which follow, they are used only in a generic and descriptive sense, and not for the purposes of limiting the present disclosure, nor the claims which follow.

The following is claimed:

1. In a multichannel data network comprising a cable television device configured to be operatively coupled to a coaxial cable at a point of demarcation, wherein the cable television device is configured to provide a bonded ground path from a ground path conductor element of the coaxial cable to a neutral conductor of an electrical service ground connection, a neutral fault current detection device configured to detect an alternating current in the ground path conductor element of the coaxial cable, the neutral fault current detection device comprising:
   a coupling element configured to be coupled to the ground path conductor element of the coaxial cable;
   a passive current sensing circuit configured to be coupled to the coupling element, the passive current sensing circuit being configured to detect a neutral fault current flow in the ground path conductor element of the coaxial cable that exceeds a threshold level when the coupling element is coupled to the ground path conductor element; and
   a passive neutral fault alert device configured to be coupled to the current sensing circuit, and generate a neutral fault condition alert when the current sensing circuit detects that the neutral fault current flow in the ground path conductor element of the coaxial cable exceeds the threshold level;
   wherein the passive current sensing circuit comprises a transformer circuit including a secondary transformer coil configured to be coupled to a primary transformer coil, the primary transformer coil being a braided sheath of an outer conductor of the coaxial cable;
   wherein the coupling element is configured to provide current flow sufficient to power the passive sensing circuit when the neutral fault current flow exceeds the threshold level;
   wherein the passive current sensing circuit is powered only by the detected neutral fault current flow in the ground path conductor element of the coaxial cable; and
   wherein the neutral fault alert device is powered only by the detected neutral fault current flow in the ground path conductor element of the coaxial cable, and only after the neutral fault current flow exceeds the threshold level.

2. The neutral fault current detection device of claim 1, wherein the cable television device is a ground block.

3. The neutral fault current detection device of claim 1, wherein the cable television device is configured to be operatively coupled to the coaxial cable at a point downstream of the point of demarcation.

4. The neutral fault current detection device of claim 1, wherein the coupling element is configured to couple with the ground path conductor element at a location between a distribution box within the multichannel data network and a subscriber's ground block.

5. The neutral fault current detection device of claim 1, wherein the ground path comprises a ground wire connecting the outer conductor of the coaxial cable to an electrical service ground connection, the coupling element being configured to couple with the ground path conductor element at a location on the ground path.

6. The neutral fault current detection device of claim 1, wherein the coupling element is configured to couple with the electrical service ground connection.

7. The neutral fault current detection device of claim 1, wherein the neutral fault alert device is a light generator configured to display a lighting sequence associated with the severity of current flow.

8. The neutral fault current detection device of claim 7, wherein the neutral fault alert device comprises a light emitting diode.

9. The neutral fault current detection device of claim 1, wherein the neutral fault alert device is a sound generator that produces an audible alarm tone when the current flow in the ground path conductor element exceeds the threshold level.

10. A neutral fault current detection device configured to detect the presence of electrical current in a ground path of a coaxial cable in a multichannel data network, the current detection device comprising:
    a passive current sensing circuit configured to sense current flow in a ground path conductor element of the coaxial cable;
    a coupling element coupled to the passive current sensing circuit, the coupling element being configured to engage the ground path conductor element of the coaxial cable; and
    a neutral fault alert device coupled to the passive current sensing circuit, the signaling device being configured to provide an alert when the current flow in only the ground path conductor element of the coaxial cable exceeds a threshold level;

wherein the passive current sensing circuit is powered by the current flow in only the ground path conductor element of the coaxial cable by way of the coupling element after the current flow in only the ground path conductor element of the coaxial cable exceeds the threshold level.

11. The neutral fault current detection device of claim 10, wherein the neutral fault alert device comprises a powered circuit, and the passive current sensing circuit is configured to trigger the powered circuit when the current flow in only the ground path conductor element exceeds the threshold level.

12. The neutral fault current detection device of claim 11, wherein the powered circuit comprises a battery power source.

13. The neutral fault current detection device of claim 10, further comprising a transmitter configured to send a message upstream, through the multichannel data network, when the neutral fault alert device provides an alert.

14. In a multichannel data network comprising a cable television device configured to be operatively coupled to a coaxial cable at a point of demarcation, wherein the cable television device is configured to provide a bonded ground path from a ground path conductor element of the coaxial cable to a neutral conductor of an electrical service ground connection, a neutral fault current detection device configured to detect an alternating current in the ground path conductor element of the coaxial cable, the neutral fault current detection device comprising:

a coupling element configured to couple with the ground path conductor element of the coaxial cable;

a passive current sensing circuit configured to be coupled to the coupling element, the passive current sensing circuit being configured to detect a neutral fault current flow condition in only the ground path conductor element of the coaxial cable when the coupling element is positioned to engage the ground path conductor element of the coaxial cable; and a neutral fault alert device configured to be coupled to the current sensing circuit, the neutral fault alert device being configured to generate a neutral fault condition alert when the current sensing circuit detects the neutral fault current flow condition only in the ground path conductor element of the coaxial cable;

wherein the passive current sensing circuit is powered by only the detected neutral fault current flow condition in the ground path conductor element of the coaxial cable by way of the coupling element after the neutral fault current flow condition in only the ground path conductor element of the coaxial cable is reached.

15. The neutral fault current detection device of claim 14, wherein the neutral fault alert device is powered by the detected neutral fault current flow condition in only the ground path conductor element of the coaxial cable.

16. The neutral fault current detection device of claim 14, wherein the passive current sensing circuit generates a trigger to power the neutral fault condition alert by a battery.

17. The neutral fault current detection device of claim 14, further comprising a transmitter, wherein the generated neutral fault condition alert comprises transmitting a message wirelessly to a receiver.

18. The neutral fault current detection device of claim 14, further comprising a transmitter, wherein the generated neutral fault condition alert comprises transmitting a message upstream, through the multichannel data network.

19. The neutral fault current detection device of claim 14, wherein the passive current sensing circuit comprises a transformer circuit including a secondary transformer coil configured to be coupled to a primary transformer coil, the primary transformer coil being a braided sheath of an outer conductor of the coaxial cable.

20. The neutral fault current detection device of claim 10, wherein the passive current sensing circuit comprises a transformer circuit including a secondary transformer coil configured to be coupled to a primary transformer coil, the primary transformer coil being a braided sheath of an outer conductor of the coaxial cable.

* * * * *